US009147819B2

(12) United States Patent
Ko et al.

(10) Patent No.: US 9,147,819 B2
(45) Date of Patent: Sep. 29, 2015

(54) CURABLE COMPOSITION

(71) Applicant: LG CHEM, LTD., Seoul (KR)

(72) Inventors: Min Jin Ko, Daejeon (KR); Myung Sun Moon, Daejeon (KR); Jae Ho Jung, Daejeon (KR); Bum Gyu Choi, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/161,563

(22) Filed: Jan. 22, 2014

(65) Prior Publication Data

US 2014/0132892 A1    May 15, 2014

Related U.S. Application Data

(63) Continuation of application No. PCT/KR2012/005875, filed on Jul. 23, 2012.

(30) Foreign Application Priority Data

Jul. 22, 2011 (KR) .................. 10-2011-0073097
Jul. 22, 2011 (KR) .................. 10-2011-0073103
Jul. 23, 2012 (KR) .................. 10-2012-0080009

(51) Int. Cl.
| | |
|---|---|
| C09K 19/00 | (2006.01) |
| H01L 33/56 | (2010.01) |
| G02F 1/1335 | (2006.01) |
| C08L 83/04 | (2006.01) |
| C08K 3/00 | (2006.01) |
| C08G 77/12 | (2006.01) |
| C08G 77/20 | (2006.01) |
| H01L 23/29 | (2006.01) |
| C08G 77/00 | (2006.01) |
| C08G 77/14 | (2006.01) |

(52) U.S. Cl.
CPC .............. *H01L 33/56* (2013.01); *C08K 3/0008* (2013.01); *C08L 83/04* (2013.01); *G02F 1/133603* (2013.01); *C08G 77/12* (2013.01); *C08G 77/14* (2013.01); *C08G 77/20* (2013.01); *C08G 77/80* (2013.01); *C08K 2201/002* (2013.01); *C08L 2205/22* (2013.01); *H01L 23/293* (2013.01); *H01L 2924/0002* (2013.01); *Y10T 428/1059* (2015.01); *Y10T 428/1068* (2015.01)

(58) Field of Classification Search
CPC ....... H01L 33/56; H01L 23/29; H01L 23/295; H01L 23/296; G02F 1/133603; C08L 83/04; C08K 5/5415; C08K 3/34; C08K 3/36; C08G 77/20; C08G 77/80; Y10T 428/1059; Y10T 428/1068
USPC ............. 428/1.5, 447, 1.52; 349/69; 257/100; 252/301.36; 525/477, 478, 31, 32, 43
See application file for complete search history.

(56) References Cited

U.S. PATENT DOCUMENTS

2011/0140289 A1* 6/2011 Shiobara et al. ............... 257/789
2012/0056236 A1* 3/2012 Hamamoto et al. ........... 257/100

FOREIGN PATENT DOCUMENTS

| CN | 101356214 | 1/2009 |
|---|---|---|
| JP | 200823119 A | 10/2008 |
| JP | 2011256251 A | 12/2011 |
| JP | 2012041496 A | 3/2012 |
| KR | 10-2006-0125267 | 12/2006 |
| KR | 10-2008-0111480 | 12/2008 |
| KR | 10-2009-0017495 | 2/2009 |
| KR | 10-2010-0058491 | 6/2010 |
| KR | 10-2011-0068867 | 6/2011 |
| WO | 2011102272 A1 | 8/2011 |

* cited by examiner

*Primary Examiner* — Ruiyun Zhang
(74) *Attorney, Agent, or Firm* — Dentons US LLP

(57) ABSTRACT

A curable composition and use thereof are provided. The composition can be useful in exhibiting excellent processability and workability, and providing a cured product which exhibits superior light extraction efficiency, crack resistance, hardness, thermal shock resistance, and adhesive properties, has superior reliability under severe conditions for a long period of time and prevents opacity and stickiness onto a surface thereof when cured. Also, the curable composition capable of preventing precipitation of an additive such as a fluorescent material or a photoconversion material and being formed into a cured product having excellent transparency even when the additive is added to the curable composition can be provided.

11 Claims, No Drawings

CURABLE COMPOSITION

This application is a Continuation Bypass of International Application PCT/KR2012/005875, with an international filing date of Jul. 23, 2012, which claims priority to and the benefit of Korean Patent Application No. 10-2011-0073097, filed on Jul. 22, 2011, Korean Patent Application No. 10-2011-0073103, filed on Jul. 22, 2011 and Korean Patent Application No. 10-2012-0080009, filed on Jul. 23, 2012, all of which are incorporated herein by reference in their entirety.

FIELD

The present application relates to a curable composition and use thereof.

BACKGROUND

Photonic elements include a light emitting diode (LED) configured to emit light upon application of an electric current, and a photoelectric conversion element configured to generate an electromotive force upon application of light. Such a photonic element is typically encapsulated by an encapsulant.

An epoxy resin having high adhesive properties and excellent dynamic durability has been widely used as an LED encapsulant (for example, Patent Documents 1 to 3). However, the epoxy resin has problems in that it has low transmittance with respect to light ranging from blue to ultraviolet (UV) wavelength ranges, and also shows lower light resistance.

Also, an ethylene vinyl acetate (EVA) material has often been used as an encapsulant configured to encapsulate the photoelectric conversion element. However, the EVA material has a problem in that it has lower adhesive properties to other parts in a module, and thus interlayer peeling may be easily induced when the module is used for a long period of time, which results in degraded efficiency or corrosion caused by moisture penetration. In addition, since the EVA material has lower resistance to UV radiation, it may be easily changed in color or discolored, which also results in degraded efficiency of the module. Further, the EVA material has a problem in that stress generated during a curing process causes damage of elements.

Meanwhile, a fluorescent material may be typically mixed with the encapsulant for LEDs to realize white light in backlight units (BLUs) using the LED or in lightings using the LED, and a photoconversion material may be mixed with an encapsulant of the photoelectric conversion element. However, the fluorescent material or the photoconversion material may precipitate during a curing process of the encapsulant before the encapsulant is sufficiently cured. To solve the above-mentioned problems, a predetermined amount of inorganic particles, for example, silica, may often be added to the encapsulant. Addition of the inorganic particles may result in improved physical properties of the encapsulant such as heat resistance, crack resistance and thermal shock resistance.

PRIOR ART DOCUMENTS

Patent Documents

Patent Document 1: Japanese Patent Laid-open Publication No. Hei 11-274571
Patent Document 2: Japanese Patent Laid-open Publication No. 2001-196151
Patent Document 3: Japanese Patent Laid-open Publication No. 2002-226551

Technical Object

The present application provides a curable composition and use thereof.

Solution

An illustrative curable composition including components can be cured by a hydrosilylation reaction such as a reaction of a hydrogen atom with an unsaturated aliphatic bond of an alkenyl group and so on.

For example, the curable composition may include a polymerization reaction product including a polyorganosiloxane containing an unsaturated aliphatic bond (hereinafter referred to as polyorganosiloxane (A)), in addition to particles.

In this application, the term "unit M" may refer to a monofunctional siloxane unit which may be represented by the formula $[R_3SiO_{1/2}]$; the term "unit D" may refer to a difunctional siloxane unit which may be represented by the formula $[R_2SiO_{2/2}]$; the term "unit T" may refer to a trifunctional siloxane unit which may be represented by the formula $[RSiO_{3/2}]$; and the term "unit Q" may refer to a tetrafunctional siloxane unit which may be represented by the formula $[SiO_{4/2}]$. As such, R may be a functional group bound to a silicon atom (Si), for example, functional group can be a hydrogen, an epoxy group, a (meth)acryloyl group, an isocyanate group, or a monovalent hydrocarbon group.

For example, the polyorganosiloxane (A) may have a linear or partially cross-linked structure. The term "linear structure" may refer to a structure of the polyorganosiloxane composed of the units M and D. In addition, the term "partially-crosslinked structure" may refer to a sufficiently long linear structure of a polyorganosiloxane, which is derived from the D unit, and to which the T or Q unit, for example, the T unit, is partially introduced. According to one illustrative embodiment, the polyorganosiloxane having a partially cross-linked structure may refer to a polyorganosiloxane having a ratio (D/(D+T+Q)) of the unit D to all the units D, T and Q greater than or equal to 0.7 and less than 1.

For example, the polyorganosiloxane (A) having a partially cross-linked structure may include a unit represented by the following Formula 1 or 2.

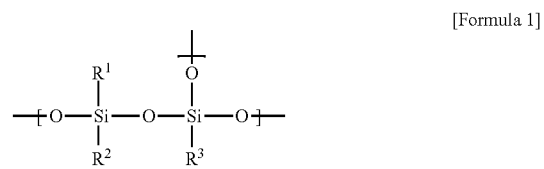

[Formula 1]

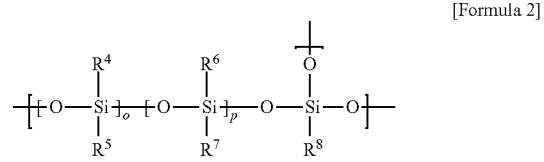

[Formula 2]

In Formulas 1 and 2, $R^1$ to $R^8$ may each independently be an epoxy group, a (meth)acryloyl group, or a monovalent hydrocarbon group; o is 0 or a positive number, p is 0 or a positive number, and o and p are not 0 at the same time. The specific ranges of o and p are may be selected from a range, for example, a range satisfying the mole fractions of respective each siloxane units in an average compositional formula of the polyorganosiloxane (A) to be described below, or a range satisfying the ratio (100×D$_3$/ArD, 100×D$_3$/D, 100×B/A, Ar/Si, and/or Ak/Si) to be described below.

Unless particularly defined otherwise, the term "epoxy group" may refer to a monovalent residue derived from a cyclic ether having three ring-forming atoms, or a compound including the cyclic ether. The epoxy group that may be used herein may include a glycidyl group, an epoxyalkyl group, a glycidoxyalkyl group, or an alicyclic epoxy group. The alicyclic epoxy group may refer to a monovalent residue that has an aliphatic hydrocarbon ring structure and is derived from a compound having a structure in which two carbon atoms used to form the aliphatic hydrocarbon ring are also used to form an epoxy group. The alicyclic epoxy group may be an alicyclic epoxy group having 6 to 12 carbon atoms, for example, a 3,4-epoxycyclohexylethyl group.

In this application, the term "(meth)acryloyl group" may refer to an acryloyl group, or a methacryloyl group.

Unless particularly defined otherwise, the term "monovalent hydrocarbon group" may refer to a monovalent residue derived from a compound composed of carbon and hydrogen atoms, or a derivative thereof. For example, the monovalent hydrocarbon group may have 1 to 25 carbon atoms. The monovalent hydrocarbon group that may be used herein may include an alkyl group, an alkenyl group, an alkynyl group, or an aryl group.

Unless particularly defined otherwise, the term "alkyl group" may refer to an alkyl group having 1 to 20 carbon atoms, 1 to 16 carbon atoms, 1 to 12 carbon atoms, 1 to 8 carbon atoms, or 1 to 4 carbon atoms. The alkyl group may be linear, branched, or cyclic. Also, the alkyl group may be optionally substituted with one or more substituents.

Unless particularly defined otherwise, the term "alkenyl group" may refer to an alkenyl group having 2 to 20 carbon atoms, 2 to 16 carbon atoms, 2 to 12 carbon atoms, 2 to 8 carbon atoms, or 2 to 4 carbon atoms. The alkenyl group may be linear, branched, or cyclic, and may be optionally substituted with one or more substituents.

Unless particularly defined otherwise, the term "alkynyl group" may refer to an alkynyl group having 2 to 20 carbon atoms, 2 to 16 carbon atoms, 2 to 12 carbon atoms, 2 to 8 carbon atoms, or 2 to 4 carbon atoms. The alkynyl group may be linear, branched, or cyclic, and may be optionally substituted with one or more substituents.

Unless particularly defined otherwise, the term "aryl group" may refer to a monovalent residue derived from a compound or a derivative thereof, which contains a benzene ring and has a structure in which two or more benzene rings are condensed or connected. In general, a category of the term "aryl group" may include an aralkyl group or an arylalkyl group in addition to the functional groups normally referred to as aryl groups. For example, the aryl group may be an aryl group having 6 to 25 carbon atoms, 6 to 21 carbon atoms, 6 to 18 carbon atoms, or 6 to 12 carbon atoms. Examples of the aryl group may include a phenyl group, a dichlorophenyl group, a chlorophenyl group, a phenylethyl group, a phenylpropyl group, a benzyl group, a tolyl group, a xylyl group, or a naphthyl group.

The substituent which may be optionally substituted with the epoxy group or the monovalent hydrocarbon group may include a halogen such as chlorine or fluorine; an epoxy group such as a glycidyl group, an epoxyalkyl group, a glycidoxyalkyl group or an alicyclic epoxy group; an acryloyl group; a methacryloyl group; an isocyanate group; a thiol group; or a monovalent hydrocarbon group, but the present application is not limited thereto.

In Formula 1, $R^1$ and $R^2$ may each independently be an alkyl group, an alkenyl group, or an aryl group according to another illustrative embodiment, and $R^3$ may be an alkyl group, or an aryl group. According to another illustrative embodiment, $R^4$ and $R^5$ in Formula 2 may also be an alkyl group, and $R^6$, $R^7$ and $R^8$ in Formula 2 may be an aryl group.

The polyorganosiloxane (A) having a partially cross-linked structure may include at least one unit represented by Formula 1 or 2. The unit of Formula 1 or 2 refers to a unit having a structure in which a silicon atom of the unit D is directly bound to a silicon atom of the unit T by means of an oxygen atom in the siloxane unit forming the polyorganosiloxane (A). The polyorganosiloxane including the unit of the |formula A| [u1] may be, for example, prepared by performing polymerization, for example, ring-opening polymerization on a mixture including a cyclic siloxane compound to be described below. By using the method, it is possible to prepare a polyorganosiloxane including the unit of Formula 1 or 2 and simultaneously having a minimized amount of silicon atoms to which an alkoxy group or a hydroxyl group is bound in the structure thereof.

The polyorganosiloxane (A) may contain at least one unsaturated aliphatic bond, or at least one functional group containing the unsaturated aliphatic bond, for example, an alkenyl group. For example, a molar ratio (Ak/Si) of the moles (Ak) of all unsaturated aliphatic bonds bound to silicon atoms of the polyorganosiloxane (A) or functional groups (for example, an alkenyl group) including the unsaturated aliphatic bonds with respect to the total moles (Si) of silicon atoms included in the polyorganosiloxane (A) may be equal to or greater than 0.01, or 0.02. Also, the molar ratio (Ak/Si) may be equal to or less than 0.2, or 0.15. When the molar ratio (Ak/Si) is adjusted to a value equal to or greater than 0.01, or 0.02, reactivity may be properly maintained, and unreacted components may be prevented from exuding from a surface of a cured product. When the molar ratio (Ak/Si) is adjusted to a value equal to or less than 0.2, or 0.15, crack resistance of the cured product may be excellently maintained.

The polyorganosiloxane (A) may include at least one aryl group, for example, an aryl group bounded to a silicon atom. For example, a molar percentage (100×B/A) of the total moles (B) of aryl groups bound to silicon atoms of the polyorganosiloxane (A) with respect to the moles (A) of all functional groups bound to silicon atoms of the polyorganosiloxane (A) may be in a range of approximately 30% to approximately 60%. According to another illustrative embodiment, a molar ratio (Ar/Si) of the total moles (Ar) of all aryl groups bound to silicon atoms included in the polyorganosiloxane (A) with respect to the total moles (Si) of silicon atoms included in the polyorganosiloxane (A) may be equal to or greater than 0.3, 0.4, or 0.6. Also, the molar ratio (Ar/Si) may be equal to or less than 1.3. Within this mole number range, excellent processability and workability of the composition, and excellent moisture resistance, light transmittance, refractive index, light extraction efficiency and hardness characteristics of the cured product may be ensured. Also, when the molar percentage (100×B/A) is equal to or greater than 30%, or the molar ratio (Ar/Si) is equal to or greater than 0.3, 0.4, or 0.6, mechanical strength and gas permeability may be ensured. On the other hand, when the molar percentage (100×B/A) is equal to or less than 60%, or the molar ratio (Ar/Si) is equal to or less than 1.3, crack resistance of the cured product may be excellently maintained.

The polyorganosiloxane (A) may include a unit D, for example, a unit represented by the following Formula 3.

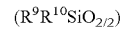   [Formula 3]

In Formula 3, $R^9$ is an epoxy group, a (meth)acryloyl group, an isocyanate group, or a monovalent hydrocarbon group, and $R^{10}$ is an aryl group. According to one illustrative embodiment, both $R^9$ and $R^{10}$ in Formula 3 may be an aryl group.

A molar percentage ($|100 \times D_1/D|$[u2]) of the total moles ($D_3$) of the unit of Formula 3 included in the polyorganosiloxane (A) with respect to the total moles (D) of the unit D included in the polyorganosiloxane (A) may be, for example, equal to or greater than 30%, or in a range of 30% to 65%, or 30% to 60%. Within this molar percentage range, mechanical strength may be excellently maintained, surface stickiness is not caused, and moisture and gas permeability may be controlled, thereby ensuring stable durability for a long period of time.

Also, a molar percentage $|(100 \times D_1/ArD|$[u3]) of the total moles ($D_3$) of the unit of Formula 3 included in the polyorganosiloxane (A) with respect to the total moles (ArD) of the unit D including aryl groups bound to silicon atoms in the unit D included in the polyorganosiloxane (A) may be, for example, equal to or greater than 70%, or 80%. Within this molar percentage range, processability and workability of the composition, and mechanical strength, gas permeability, moisture resistance, light transmittance, refractive index, light extraction efficiency and hardness characteristics of the cured product may be properly ensured.

According to one illustrative embodiment, the polyorganosiloxane (A) may have an average compositional formula represented by the following Formula 4.

[Formula 4]

In Formula 4, $R^{11}$ is each independently an epoxy group, a (meth)acryloyl group, an isocyanate group, or a monovalent hydrocarbon group, provided that at least one of $R^{11}$ is an alkenyl group, and that at least one of $R^{11}$ is an aryl group, the sum (l+m+n+o) of l, m, n and o is 1, l is in a range of 0 to 0.5, m is in a range of 0 to 0.98, n is in a range of 0 to 0.8, o is in a range of 0 to 0.2, and m/(m+n+o) is in a range of 0.7 to 1.

In this application, a polyorganosiloxane represented by a predetermined average compositional formula includes a case in which a polyorganosiloxane is composed of a single component represented by the predetermined average compositional formula, as well as cases in which the polyorganosiloxane is composed of a mixture of at least two components, and an average composition of the two components is represented by the predetermined average compositional formula.

In Formula 4, at least one of $R^{11}$ is an alkenyl group, and at least one of $R^{11}$ is an aryl group. The alkenyl and aryl groups may be, for example, included so that the alkenyl and aryl groups can satisfy the above-described molar ratio/percentage, for example, $100 \times D_3/ArD$, $100 \times D_3/D$, $100 \times B/A$, Ar/Si, and/or Ak/Si.

In the average compositional formula of Formula 4, l, m, n and o represent molar ratios of the siloxane units of the polyorganosiloxane $|(L)|$[u4]. When the sum (l+m+n+o) is set as 1, l may be in a range of 0 to 0.5, or 0.01 to 0.15, m may be in a range of 0 to 0.98, 0.5 to 0.98, or 0.65 to 0.97, n may be in a range of 0 to 0.8, 0 to 0.2, or 0 to 0.30, and o may be in a range of 0 to 0.2, or 0 to 0.1. When the polyorganosiloxane (A) has a partially cross-linked structure, n may be in a range of 0.01 to 0.30. Also, m/(m+n+o) may be in a range of 0.7 to 1. When the polyorganosiloxane (A) has a partially cross-linked structure, m/(m+n+o) may be equal to or greater than 0.7 and less than 1, or may be in a range of 0.7 to 0.97, or 0.65 to 0.97. The ratio of the siloxane unit may be adjusted as described above to ensure proper physical properties according to applications.

According to another illustrative embodiment, the polyorganosiloxane (A) may have an average compositional formula represented by the following Formula 5.

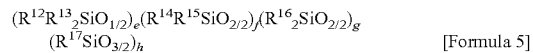

[Formula 5]

In Formula 5, $R^{12}$ is a monovalent hydrocarbon group, $R^{13}$ is an alkyl group having 1 to 4 carbon atoms, $R^{14}$ is an alkyl group, an alkenyl group, or an aryl group, or an aryl group, $R^{15}$ is an aryl group, $R^{16}$ is an alkyl group, $R^{17}$ is a monovalent hydrocarbon group, the sum (e+f+g+h) of e, f, g and h is 1, e is in a range of 0.01 to 0.15, f is in a range of 0 to 0.97, g is in a range of 0 to 0.97, h is in a range of 0 to 0.30 and (f+g)/(f+g+h) is in a range of 0.7 to 1.

In the average compositional formula of Formula 5, at least one of $R^{12}$, $R^{14}$ and $R^{17}$ may be an alkenyl group, and at least one of $R^{12}$, $R^{14}$ and $R^{17}$ may be an aryl group. For example, the alkenyl group and the aryl group may be included so that the alkenyl group and the aryl group can satisfy the above-described molar ratio/percentage, for example, $100 \times D_3/ArD$, $100 \times D_3/D$, $100 \times B/A$, Ar/Si, and/or Ak/Si.

In the average compositional formula of Formula 5, e, f, g and h represent molar ratios of the siloxane units of the polyorganosiloxane (A). When the sum (e+f+g+h) is set as 1, e may be in a range of 0.01 to 0.15, f may be in a range of 0 to 0.97, or 0.65 to 0.97, g may be in a range of 0 to 0.97, or 0.65 to 0.97, and h may be in a range of 0 to 0.30. When the polyorganosiloxane (A) has a partially cross-linked structure, h may be in a range of 0.01 to 0.30. Also, (f+g)/(f+g+h) may be in a range of 0.7 to 1. When the polyorganosiloxane (A) has a partially cross-linked structure, (f+g)/(f+g+h) may be greater than or equal to 0.7 and less than 1, or may be in a range of 0.7 to 0.97, or 0.65 to 0.97. Proper physical properties may be ensured according to applications by adjusting the molar ratio of the siloxane unit as described above.

According to one illustrative embodiment, f and g in the average compositional formula of Formula 5 may not be 0 at the same time. When f and g are not 0 at the same time, f/g may be in a range of 0.4 to 2.0, 0.4 to 1.5, or 0.5 to 1.

A polymerization reaction product including the polyorganosiloxane (A) may be, for example, a ring-opening polymerization reaction product of a mixture including a cyclic polyorganosiloxane. The polymerization reaction product may include a low molecular weight cyclic compound. The term "low molecular weight cyclic compound" may refer to a cyclic compound having a weight-average molecular weight ($M_w$) of 800 or less, 750 or less, or 700 or less, for example, a cyclic polyorganosiloxane. For example, the polymerization reaction product may include the cyclic compound at a content of 7% by weight or less, 5% by weight or less, or 3% by weight or less. A lower limit of the content of the cyclic compound may be, for example, 0% by weight, or 1% by weight. By doing this, a cured product having excellent long-term reliability and crack resistance may be provided. The term "weight-average molecular weight" refers to a value converted with respect to a polystyrene standard as measured by gel permeation chromatography (GPC). Unless particularly defined otherwise in this application, the term "molecular weight" may refer to a weight-average molecular weight.

For example, the low molecular weight cyclic compound may be a compound represented by the following Formula 6.

[Formula 6]

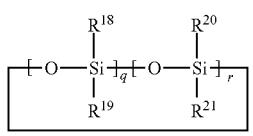

In Formula 6, $R^{18}$ and $R^{19}$ are each independently an alkyl group, $R^{20}$ and $R^{21}$ are each independently an aryl group, q is 0 or a positive number, and r is 0 or a positive number, provided that the sum (g+r) of g and r may be in a range of 2 to 10, 3 to 10, 3 to 9, 3 to 8, 3 to 7, or 3 to 6.

polyorganosiloxane (A) or the polymerization reaction product including the same, an area of peaks derived from alkoxy groups bound to silicon atoms in the spectra measured by $^1$H NMR may be less than or equal to 0.01 or 0.005, or may be 0 with respect to an area of peaks derived from unsaturated aliphatic bond-containing functional groups bound to silicon atoms, for example, alkenyl groups such as vinyl groups. Within this peak area range, proper viscosity characteristics may be exhibited, and other physical properties may be excellently maintained as well.

According to one illustrative embodiment, the polyorganosiloxane (A) or the polymerization reaction product including the same may have an acid value of 0.02 or less, 0.01 or less, or 0, as measured by KOH titration. Within this acid value range, proper viscosity characteristics may be exhibited, and other physical properties may be excellently maintained as well.

According to one illustrative embodiment, the polyorganosiloxane (A) or the polymerization reaction product including the same may have a viscosity at 25° C. of 2,000 cP or more, 5,000 cP or more, or 7,000 cP or more. Within this viscosity range, processability and hardness characteristics may be properly maintained. An upper limit of the viscosity is not particularly limited. However, the viscosity may be, for example, less than or equal to 100,000 cP, 90,000 cP, 80,000 cP, 70,000 cP, or 65,000 cP.

The polyorganosiloxane (A) or the polymerization reaction product including the same may have a molecular weight of 1,000 to 50,000, or 1,500 to 30,000. Within this molecular weight range, formability, hardness and strength characteristics may be properly maintained.

The polymerization reaction product including the polyorganosiloxane (A) may be, for example, a ring-opening polymerization reaction product of a mixture including a cyclic polyorganosiloxane. When the polyorganosiloxane (A) has a partially cross-linked structure, the mixture may, for example, have a cage structure or a partial cage structure, or may further include a polyorganosiloxane including the unit T.

For example, a compound represented by the following Formula 7 may be used as the cyclic polyorganosiloxane compound.

[Formula 7]

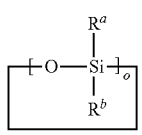

In Formula 7, $R^a$ and $R^b$ are each independently an epoxy group, a (meth)acryloyl group, an isocyanate group, or a monovalent hydrocarbon group, and o is in a range of 3 to 6.

The cyclic polyorganosiloxane may also include a mixture of a compound represented by the following Formula 8 and a compound represented by the following Formula 9.

[Formula 8]

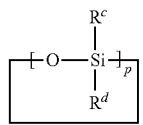

[Formula 9]

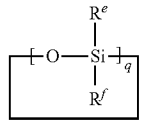

In Formulas 8 and 9, $R^c$ and $R^d$ are each independently an alkyl group, $R^e$ and $R^f$ are each independently an aryl group, p is 3 to 6, and q is 3 to 6.

In Formulas 7 to 9, the specific kinds of $R^a$ to $R^f$, the specific numerical values of o, p and q, and the ratios of the respective components in the mixture may be determined according to the desired structure of the polyorganosiloxane (A).

When the polyorganosiloxane (A) has a partially cross-linked structure, the mixture may be a polyorganosiloxane having a cage structure, which may, for example, include a compound having an average compositional formula represented by the following Formula 10, or a unit T, or may be a polyorganosiloxane having a partial cage structure, which may further include a compound having an average compositional formula represented by the following Formula 11.

$$[R^g SiO_{3/2}] \quad \text{[Formula 10]}$$

$$[R^h R^i{}_2 SiO_{1/2}]_p [R^j SiO_{3/2}]_q \quad \text{[Formula 11]}$$

In Formulas 10 and 11, $R^g$, $R^h$ and $R^j$ may each independently be an epoxy group, a (meth)acryloyl group, an isocyanate group, or a monovalent hydrocarbon group, $R^i$ may be an alkyl group having 1 to 4 carbon atoms, p may be 1 to 3, and q may be 1 to 10. When the polyorganosiloxane having an average compositional formula of Formula 11 has a partial cage structure, p may be in a range of 1 to 2, and q may be in a range of 3 to 10.

In Formulas 10 and 11, the specific kinds of $R^g$ to $R^j$, the specific numerical values of p and q, and the ratios of the respective components in the mixture may be determined according to the desired structure of the polyorganosiloxane (A).

When the cyclic polyorganosiloxane reacts with the polyorganosiloxane having a cage structure and/or partial cage structure, a polyorganosiloxane having a desired partially cross-linked structure may be synthesized to have a sufficient molecular weight. As described above, a target compound having excellent physical properties may also be prepared by minimizing the number of functional groups such as alkoxy groups or hydroxyl groups bound to silicon atoms in the polyorganosiloxane or the polymerization reaction product including the same.

According to one illustrative embodiment, the mixture may further include a compound represented by the following Formula 12.

$$(R^k R^l{}_2 Si)_2 O \quad \text{[Formula 12]}$$

In Formula 12, $R^k$ and $R^l$ are each independently an epoxy group, a (meth)acryloyl group, an isocyanate group, or a monovalent hydrocarbon group.

In Formula 12, the specific kind of the monovalent hydrocarbon group and the blending ratio in the mixture may be determined by the desired structure of the polyorganosiloxane (A).

Reactions of the respective components in the mixture may be performed in the presence of a proper catalyst. Therefore, the mixture may further include a catalyst. For example, a base catalyst may be used as the catalyst. Proper examples of the base catalyst may include a metal hydroxide such as KOH, NaOH or CsOH; and a quaternary ammonium compound such as a metal silanolate including an alkali metal compound and siloxane, tetramethylammonium hydroxide, tetraethylammonium hydroxide, or tetrapropylammonium hydroxide, but the present application is not limited thereto.

The ratio of the catalyst in the mixture may be properly selected in consideration of desired reactivity, and the like. For example, the catalyst may be included at a content of 0.01 parts by weight to 30 parts by weight, or 0.03 parts by weight to 5 parts by weight, based on a total of 100 parts by weight of a reactant in the mixture. Unless particularly defined otherwise in this application, the unit "part(s) by weight" may refer to a weight ratio between the respective components.

According to one illustrative embodiment, the reaction of the mixture may be performed in the presence of a proper solvent. Any kinds of solvents may be used as long as a catalyst may be properly mixed with the reactant in the mixture, that is, disiloxane or polysiloxane, and the solvents may not have great influence on reactivity. Examples of the solvent may include an aliphatic hydrocarbon-based solvent such as n-pentane, i-pentane, n-hexane, i-hexane, 2,2,4-trimethylpentane, cyclohexane, or methylcyclohexane; an aromatic solvent such as benzene, toluene, xylene, trimethylbenzene, ethyl benzene, or methylethyl benzene; a ketone-based solvent such as methylethylketone, methylisobutylketone, diethylketone, methyl n-propyl ketone, methyl n-butyl ketone, cyclohexanone, methylcyclohexanone, or acetylacetone; an ether-based solvent such as tetrahydrofuran, 2-methyl tetrahydrofuran, ethyl ether, n-propyl ether, isopropyl ether, diglyme, dioxin, dimethyl dioxin, ethylene glycol monomethyl ether, ethylene glycol dimethyl ether, ethylene glycol diethyl ether, propylene glycol monomethyl ether, or propylene glycol dimethyl ether; an ester-based solvent such as diethyl carbonate, methyl acetate, ethyl acetate, ethyl lactate, ethylene glycol monomethyl ether acetate, propylene glycol monomethyl ether acetate, or ethylene glycol diacetate; and an amide-based solvent such as N-methyl pyrrolidone, formamide, N-methyl formamide, N-ethyl formamide, N,N-dimethyl acetamide, or N,N-diethylacetamide, but the present application is not limited thereto.

For example, the reaction, for example, ring-opening polymerization reaction, of the mixture may be performed after addition of a catalyst, and for example, may be performed at a reaction temperature ranging from 0° C. to 150° C., or 30° C. to 130° C. Also, the reaction time may be, for example, adjusted within a range of an hour to 3 days.

The curable composition may include particles, for example, inorganic particles. The particles may satisfy the following Equation 1.

$$|A-B| \leq 0.1 \quad \text{[Equation 1]}$$

In equation 1, A represents a refractive index of the curable composition or a cured product thereof which does not include the particles, and B represents a refractive index of the particles. The refractive index refers to a refractive index with respect to light having a wavelength of 450 nm. The absolute value of a difference between A and B may be less than or equal to 0.08, 0.07, or 0.05 according to another illustrative embodiment.

The particles may serve to prevent precipitation of a fluorescent material or a photoconversion material which may be blended in the curable composition, and improve heat resistance, a heat-dissipating property, and crack resistance, thereby improving reliability as a whole. Also, the particles may serve to maintain transparency of the composition or cured product thereof and improve brightness of a device as well.

Various kinds of particles used as a filler in the related art may be used as long as they satisfy Equation 1. According to one illustrative embodiment, particles having a refractive index (B) of 1.40 or more, 1.45 or more, 1.48 or more, 1.50 or more, or 1.55 or more may be used as the particles.

The particles that may be used herein may, for example, include silica ($SiO_2$), organosilica, alumina, aluminosilica, titania, zirconia, cerium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate, or magnesium oxide. In this case, the particles may be in a porous shape, or a hollow particle shape.

For example, the particles may have an average particle size of 1 nm to 50 μm, or 2 nm to 10 μm. When the average particle size is greater than or equal to 1 nm, the particles may be uniformly dispersed in the composition or cured product thereof. On the other hand, when the average particle size is less than or equal to 50 μm, the particles may be effectively dispersed, and precipitation of the particles may also be prevented.

The particles may be included in the composition at a content of 0.1 parts by weight to 30 parts by weight, 0.1 parts by weight to 25 parts by weight, 0.1 parts by weight to 20 parts by weight, 0.1 parts by weight to 15 parts by weight, or 0.5 parts by weight to 15 parts by weight, relative to 100 parts by weight of the polyorganosiloxane (A). When the content of the particles is greater than or equal to 0.1 parts by weight, the particles may have an excellent effect in preventing precipitation of a fluorescent material or a photoconversion material, or improving reliability of a device. On the other hand, when the content of the particles is less than or equal to 30 parts by weight, processability may be excellently maintained.

The curable composition may further include a cross-linked polyorganosiloxane (hereinafter referred to as a polyorganosiloxane (C)). The term "cross-linked polyorganosiloxane" may refer to a polyorganosiloxane which essentially includes a unit T or a unit Q as the siloxane unit and in which a ratio (D/(D+T+Q)) of the unit D with respect to all the units D, T and Q is less than 0.7.

For example, the cross-linked polyorganosiloxane (C) may have an average compositional formula represented by the following Formula 13.

$$(R^{22}_3SiO_{1/2})_a(R^{22}_2SiO_{2/2})_b(R^{22}SiO_{3/2})_c(SiO_{4/2})_d \quad \text{[Formula 13]}$$

In Formula 13, $R^{22}$ is each independently an epoxy group, a (meth)acryloyl group, an isocyanate group, or a monovalent hydrocarbon group, provided that at least one of $R^{22}$ is an alkenyl group, and that at least one of $R^{22}$ is an aryl group, the sum (a+b+c+d) of a, b, c and d is 1, a is in a range of 0 to 0.5, b is in a range of 0 to 0.3, c is in a range of 0.3 to 0.95, d is in a range of 0 to 0.2 and b/(b+c+d) is less than or equal to 0.3, and c/(c+d) is greater than or equal to 0.8.

In Formula 13, at least one or two of $R^{22}$ may be an alkenyl group. According to one illustrative embodiment, a molar ratio (Ak/Si) of the moles (Ak) of alkenyl groups with respect to the total moles (Si) of silicon atoms included in the polyorganosiloxane (C) may be greater than or equal to 0.05, or 0.15. Also, the molar ratio (Ak/Si) may be less than or equal to 0.4, 0.35, or 0.3. When the molar ratio (Ak/Si) is adjusted to a value greater than or equal to 0.05 or 0.15, reactivity may be properly maintained, and the unreacted components may be prevented from exuding from a surface of a cured product. On the other hand, when the molar ratio (Ak/Si) is adjusted to a value less than or equal to 0.4, 0.35 or 0.3, hardness characteristics, crack resistance and thermal shock resistance of the cured product may be excellently maintained.

Also, at least one of $R^{22}$ in Formula 13 may be an aryl group. As a result, a refractive index and hardness characteristics of the cured product may be effectively controlled. For example, a molar ratio (Ar/Si) of the moles (Ar) of aryl groups with respect to the total moles (Si) of silicon atoms of the polyorganosiloxane (C) may be greater than or equal to 0.35, or 0.5. Also, the molar ratio (Ar/Si) may be less than or equal to 1.5, 1.2, or 1.1. When the molar ratio (Ar/Si) is adjusted to a value greater than or equal to 0.35 or 0.5, a refractive index and hardness characteristics of the cured product may be maximized. On the other hand, when the molar ratio (Ar/Si) is adjusted to a value less than or equal to 1.5, 1.2 or 1.1, viscosity and thermal shock resistance of the composition may be properly maintained.

In the average compositional formula of Formula 13, a, b, c and d are each independently represent molar ratios of the respective siloxane units. Herein, the sum of a, b, c and d is set as 1, a is in a range of 0 to 0.5, or 0.05 to 0.5, b is in a range of 0 to 0.3, c is in a range of 0 to 0.95, or 0.6 to 0.95, and d is in a range of 0 to 0.2. To maximize strength, crack resistance and thermal shock resistance of the cured product, the molar ratios a, b, c and d may be adjusted so that (a+b)/(a+b+c+d) can be in a range of 0.2 to 0.7, or can be greater than or equal to 0.2 and less than 0.7. As such, the structure of the polyorganosiloxane (C) may also be controlled so that b/(b+c+d) can be less than or equal to 0.3, and c/(c+d) can be greater than or equal to 0.8. As such, a lower limit of b/(b+c+d) is not particularly limited. For example, b/(b+c+d) may be greater than 0. As such, an upper limit of c/(c+d) is not particularly limited, but may also be, for example, 1.0.

The polyorganosiloxane (C) may have a viscosity at 25° C. of 5,000 cP or more, or 1,000,000 cP or more. Accordingly, processability before curing and hardness characteristics after curing may be properly maintained. Also, the polyorganosiloxane (C) may, for example, have a molecular weight of 800 to 20,000, or 800 to 10,000. When the molecular weight of the polyorganosiloxane (C) is adjusted to a value greater than or equal to 800, formability before curing and strength after curing may be effectively maintained. On the other hand, when the molecular weight is adjusted to a value less than or equal to 20,000 or 10,000, viscosity may be properly maintained.

The polyorganosiloxane (C) may be, for example, prepared using a method of preparing a polysiloxane as widely known in the related art, or may be prepared in substantially the same manner as in the polyorganosiloxane (A).

For example, the polyorganosiloxane (C) may be included so that a weight ratio (A/(A+C)) of the polyorganosiloxane (A) in a mixture of the polyorganosiloxane (A) and the polyorganosiloxane (C) can be in a range of 10 to 50. According to another illustrative embodiment, the polyorganosiloxane (C) may be, for example, included at a content of 50 parts by weight to 800 parts by weight, relative to 100 parts by weight of the polyorganosiloxane (A). Within this content range, strength and thermal shock resistance of the cured product may be excellently maintained, and stickiness onto a surface thereof may be prevented.

The curable composition may further include a silicon compound containing hydrogen atoms bound to silicon atoms (a silicon compound (D)). The silicon compound (D) may have one or two or more hydrogen atoms.

The silicon compound (D) may serve as a cross-linking agent which cross-links a composition by reaction with an unsaturated aliphatic bond-containing functional group of the polyorganosiloxane. For example, a cross-linking or curing reaction may be performed by addition reaction of hydrogen atoms of the silicon compound (D) with an unsaturated aliphatic bond, such as an alkenyl group, of the polyorganosiloxane (A) or (C).

Various kinds of silicon compounds may be used as the silicon compound (D) as long as they contain hydrogen atoms (Si—H) bound to silicon atoms in the molecule. For example, the silicon compound (D) may be a linear, branched, cyclic or cross-linked polyorganosiloxane. The silicon compound (D) may be a compound having 2 to 1000 silicon atoms, or 3 to 300 silicon atoms.

For example, the silicon compound (D) may be a compound represented by the following Formula 14, or a compound having an average compositional formula represented by the following Formula 15.

  [Formula 14]

  [Formula 15]

In Formulas 14 and 15, $R^{23}$ is each independently hydrogen, or a monovalent hydrocarbon group, provided that at least two of $R^{23}$ are hydrogen, and that at least one of $R^{23}$ is an aryl group, n is in a range of 1 to 100, $R^{24}$ is each independently hydrogen, or a monovalent hydrocarbon group, provided that at least two of $R^{24}$ are hydrogen, and that at least one of $R^{24}$ is an aryl group, the sum (a+b+c+d) of a, b, c and d is 1, a is in a range of 0.1 to 0.8, b is in a range of 0 to 0.5, c is in a range of 0.1 to 0.8, d is in a range of 0 to 0.2, and c and d are not 0 at the same time.

The compound of Formula 14 is a linear siloxane compound having at least two hydrogen atoms bound to silicon atoms. In Formula 14, n may be in a range of 1 to 100, 1 to 50, 1 to 25, 1 to 10, or 1 to 5.

The compound represented by the average compositional formula of Formula 15 may be a polysiloxane having a cross-linking structure.

According to one illustrative embodiment, a molar ratio (H/Si) of the moles (H) of hydrogen atoms bound to silicon atoms with respect to the total moles (Si) of silicon atoms in the silicon compound (D) may be greater than or equal to 0.2, or 0.3. The molar ratio (H/Si) may also be less than or equal to 0.8, or 0.75. When the molar ratio (H/Si) is adjusted to a value greater than or equal to 0.2 or 0.3, a curing property of the composition may be properly maintained. On the other hand, when the molar ratio (H/Si) is adjusted to a value less than or equal to 0.8 or 0.75, crack resistance and thermal shock resistance may also be excellently maintained.

The silicon compound (D) may include at least one aryl group. As a result, at least one of $R^{23}$ in Formula 14, or at least one of $R^{25}$ in Formula 15 may be an aryl group, for example, an aryl group having 6 to 21 carbon atoms, 6 to 18 carbon atoms, or 6 to 12 carbon atoms, or a phenyl group. Therefore, refractive index and hardness characteristics of the cured product may be effectively controlled. For example, a molar ratio (Ar/Si) of the moles (Ar) of aryl groups with respect to the total moles (Si) of silicon atoms included in the silicon compound (D) may be greater than or equal to 0.3, 0.4, or 0.5. Also, the molar ratio (Ar/Si) may be less than or equal to 1.5, 1.3, 1.0, or 0.8. When the molar ratio (Ar/Si) is adjusted to a value greater than or equal to 0.3, 0.4 or 0.5, refractive index and hardness characteristics of the cured product may be maximized. On the other hand, when the molar ratio (Ar/Si) is adjusted to a value less than or equal to 1.5, 1.3, 1.0 or 0.8, viscosity and crack resistance characteristics of the composition may be properly maintained.

The silicon compound (D) may have a viscosity at 25° C. of 0.1 cP to 100,000 cP, 0.1 cP to 10,000 cP, 0.1 cP to 1,000 cP, or 0.1 cP to 300 cP. Within this viscosity range, processability of the composition and hardness characteristics of the cured product may be excellently maintained.

Also, the silicon compound (D) may have a molecular weight of, for example, less than 2,000, less than 1,000, or less than 800. When the silicon compound (D) has a molecular weight of 1,000 or more, strength of the cured product may be degraded. A lower limit of the molecular weight of the silicon compound (D) is not particularly limited. For example, the molecular weight of the silicon compound (D) may be 250. The molecular weight of the silicon compound (D) may refer to a weight-average molecular weight or a typical molecular weight of a compound.

A method of preparing the silicon compound (D) is not particularly limited. For example, the silicon compound (D) may be prepared using a method widely known in the related art to prepare a polyorganosiloxane, or may be prepared in substantially the same manner as in the polyorganosiloxane (A).

The content of the silicon compound (D) may be adjusted so that a molar ratio (H/Ak) of the moles (H) of hydrogen atoms bound to silicon atoms included in the silicon compound (D) with respect to the total moles (Ak) of unsaturated aliphatic bond-containing functional groups included in the curable composition, for example, unsaturated aliphatic bond-containing functional groups, such as alkenyl groups, included in the polyorganosiloxane (A) and/or (B) can be greater than or equal to 0.5, or 0.7. The content of the silicon compound (D) may be adjusted so that the molar ratio (H/Ak) can be adjusted to a value less than or equal to 2.0, or 1.5. As a result, a composition which exhibits excellent processability and workability before the composition is cured, and exhibits superior crack resistance, hardness characteristics, thermal shock resistance and adhesive properties and prevents opacity and stickiness onto a surface thereof after the composition is cured may be provided.

The curable composition may further include a hydrosilylation catalyst. The hydrosilylation catalyst may be used to facilitate a hydrosilylation reaction. All kinds of typical components known in the related art may be used as the hydrosilylation catalyst. Examples of the hydrosilylation catalyst may include platinum-based, palladium-based and rhodium-based catalysts. In the present application, the platinum-based catalyst may be used in consideration of catalytic efficiency. Examples of the platinum-based catalyst may include chloroplatinic acid, platinum tetrachloride, an olefin complex of platinum, an alkenyl siloxane complex of platinum, or a carbonyl complex of platinum, but the present application is not limited thereto.

The content of the hydrosilylation catalyst is not particularly limited as long as the hydrosilylation catalyst can be used at a catalytic amount, that is, a suitable amount to serve as a catalyst. In general, the hydrosilylation catalyst may be used at a content of 0.1 ppm to 500 ppm, or 0.2 ppm to 100 ppm, based on the total atomic weight of the platinum, palladium or rhodium.

Also, the curable composition may further include a tackifier to improve an adhesive property to various bases. The tackifier may be a component that can improve self-adhesive properties of the curable composition or cured product thereof, particularly a component that can improve self-adhesive properties to a metal and an organic resin.

The tackifier that may be used herein may include a silane compound containing one or two or more functional groups selected from the group consisting of an alkenyl group (i.e., a vinyl group), a (meth)acryloyloxy group, a hydrosilyl (SiH) group, an epoxy group, an alkoxy group, an alkoxysilyl group, a carbonyl group and a phenyl group; or an organic silicon compound such as a cyclic or linear siloxane compound having 2 to 30 silicon atoms or 4 to 20 silicon atoms, but the present application is not limited thereto. In the present application, one or two kinds of the tackifiers may be further mixed, and used.

When the tackifier is included in the curable composition, the tackifier may be, for example, included at a content of 0.1 parts by weight to 20 parts by weight, based on the sum (i.e., 100 parts by weight) of the other compounds included in the curable composition, for example, polyorganosiloxane (A), polyorganosiloxane (C) and/or silicon compound (D). However, the content of the tackifier may be properly altered in consideration of an effect of improving desired adhesive properties.

The curable composition may further include at least one selected from the group consisting of a reaction inhibitor such as 2-methyl-3-butyn-2-ol, 2-phenyl-3-1-butyn-2-ol, 3-methyl-3-penten-1-yne, 3,5,-dimethyl-3-hexen-1-yne, 1,3,5,7-tetramethyl-1,3,5,7-tetrahexenylcyclotetrasiloxane, or ethynylcyclohexane; an inorganic filler such as silica, alumina, zirconia, or titania; a carbon-functional silane having an epoxy group and/or an alkoxysilyl group or a partially hydrolysed condensation product or siloxane compound thereof; a thixotropic agent, such as fumed silica, which may be used together with a polyether; an antistatic-conducting agent such as a metal powder (for example, silver, copper, or aluminum), or various carbon materials; and a color control agent such as a pigment or a dye, as necessary.

The curable composition may further include a fluorescent material. Kinds of fluorescent materials that may be used herein are not particularly limited. For example, a kind of a conventional fluorescent material applied to an LED package may be used to realize white light.

For example, the curable composition may further include a photoconversion material, as necessary, when the curable composition is used in a photoelectric conversion element. For example, a material that can absorb UV light and emit visual or near-infrared light may be used as the photoconversion material.

According to one illustrative embodiment, the photoconversion material may be a material represented by the following Formula 16.

$$Eu_wY_xO_yS_z \qquad \text{[Formula 16]}$$

In Formula 16, w is in a range of 0.01 to 0.2, x is in a range of 2 to 3, y is in a range of 2 to 3, and z is in a range of 0 to 1.

In the curable composition, the photoconversion material may be included at a content of 0.1 parts by weight to 10 parts by weight, or 0.2 parts by weight to 5 parts by weight, relative to 100 parts by weight of the mixture of polyorganosiloxane (A) or polyorganosiloxane (A) and polyorganosiloxane (B). Degradation of luminance efficiency by scattering may be prevented and a photoconversion effect may also be maximized by adjusting the content of the photoconversion material as described above.

According to one illustrative embodiment, the curable composition may have a light transmittance of 85% or more, or 90% or more, as measured in a thickness direction for a planar specimen having a thickness of 1 mm prepared by curing the curable composition. For example, the light transmittance may be light transmittance measured with respect to light with a wavelength of 450 nm using a UV-VIS spectrometer after the curable composition is coated in a planar shape and cured at a constant temperature of 60° C. for 30 minutes, and then at a constant temperature of 150° C. for an hour.

Another aspect of the present application provides a semiconductor, for example, A photonic semiconductor package. The photonic semiconductor package according to one illustrative embodiment may include a photonic element encapsulated by a cured product of the curable composition.

Examples of semiconductor elements encapsulated by the encapsulant may include a diode, a transistor, a thyristor, a photo coupler, a charge coupled device (CCD), a solid-phase image pickup device, an integral integrated circuit (IC), a hybrid IC, a large-scale integration (LSI), a very-large-scale integration (VLSI), and an LED.

For example, the photonic element may be an LED or an organic light emitting diode (OLED) which emits light when an electric current is applied to the photonic element, or a photoelectric conversion element which generates an electromotive force when light is applied to the photonic element.

For example, the LED that may be used herein may include a light emitting diode formed by stacking a semiconductor material on a substrate. Examples of the semiconductor material may include GaAs, GaP, GaAlAs, GaAsP, AlGaInP, GaN, InN, AlN, InGaAlN or SiC, but the present application is not limited thereto. Also, examples of the substrate may include a monocrystalline material such as sapphire, spinel, SiC, Si, ZnO or GaN.

In manufacture of an LED, a buffer layer may also be formed between the substrate and the semiconductor material, as necessary. GaN or AlN may be used for the buffer layer. A method of stacking a semiconductor material on a substrate is not particularly limited. For example, the semiconductor material may be stacked using a method such as metal organic chemical vapor deposition (MOCVD), hydride vapor phase epitaxy (HDVPE), or congruent melt growth. Also, a structure of the LED may be, for example, a mono-junction, a heterojunction, or a dual heterojunction junction such as an MIS junction, a PN junction, or a PIN junction. Also, the LED may be formed with a single or multiple quantum well structure.

According to one illustrative embodiment, an emission wavelength of the LED may be, for example, in a range of 250 nm to 550 nm, preferably 300 nm to 500 nm, and more preferably 330 nm to 470 nm. The emission wavelength may refer to a major emission peak wavelength. When the emission wavelength of the LED is set within this wavelength range, a white LED having high energy efficiency and excellent color reproducibility may be obtained with a longer lifespan.

The LED may be encapsulated using the curable composition. Also, the LED may be encapsulated only by the curable composition, or another encapsulant may be optionally used together with the curable composition. When two kinds of encapsulants are used together, encapsulation of an LED may be performed by encapsulating the LED with the curable composition and encapsulating the curable composition with another encapsulant, or by encapsulating the LED with another encapsulant and encapsulating the encapsulant with the curable composition. Another encapsulant may include an epoxy resin, a silicone resin, an acrylic resin, a urea resin, an imide resin, or glass.

As a method of encapsulating an LED with the curable composition, for example, a method of injecting a curing composition into a mold-type cast in advance, dipping a lead frame in which an LED is fixed in the curable composition and curing the curable composition, or a method of injecting a curing composition into a cast having an LED inserted therein and curing the curing composition, may be used. A method of injecting a composition may include injection using a dispenser, transfer molding, or injection molding. As another encapsulation method, a method of coating a composition on an LED using a method such as dripping, stencil printing, or screen printing, or a mask and curing the composition, or a method of injecting a composition into a cup having an LED disposed at a lower portion thereof using a dispenser and curing the composition may also be used.

Also, the curable composition may be used as a die-bond material for fixing an LED in a lead terminal or a package, or used for a passivation film or a package substrate formed on an LED, as necessary.

When curing of the composition is required, the curing method is not particularly limited. For example, the composition may be cured at a constant temperature of 60° C. to 200° C. for 10 minutes to 5 hours, or a series of curing processes may be carried out by performing two or more operations at a suitable temperature for a suitable period of time.

The shape of the encapsulant is not particularly limited. For example, the encapsulant may be formed in a shell-shaped lens shape, a planar shape, or a thin-film shape.

Also, performance of the LED may be further improved using a method known in the prior art. For example, a method of improving performance of the LED may include a method of installing a light-reflecting layer or a light-condensing layer in a rear surface of an LED, a method of forming a complementary color-tinting unit at a bottom surface of an LED, a method of installing a layer for absorbing light having shorter wavelengths than a major emission peak on an LED, a method of encapsulating an LED and further molding the LED with a hard material, a method of fixing an LED through a through hole, or a method of bringing an LED into contact with a lead member using a method such as flip-chip bonding and extracting light toward a substrate.

For example, the photonic semiconductor, for example, an LED, may be effectively applied to backlights for LCDs, lightings, light sources for various sensors, printers or photocopiers, light sources for dashboards in vehicles, traffic lights, pilot lamps, light sources for display devices or planar light emitting bodies, displays, decorations, or various lights.

Effect

This present application may be providing a cured product which exhibits excellent processability and workability, and which exhibits superior light extraction efficiency, crack resistance, hardness, thermal shock resistance, and adhesive properties when it cured, and which has superior reliability under severe conditions for a long period of time and prevents opacity and stickiness onto a surface. Also, the present application can provide a curable composition capable of preventing precipitation of an additive such as a fluorescent material or a photoconversion material when the additive is added to the curable composition and being formed into a cured product having excellent transparency.

ILLUSTRATIVE EMBODIMENTS

Hereinafter, the curable composition will be described in further detail with reference to Examples and Comparative Examples. However, it should be understood that the following Examples are not intended to limit the scope of the curable composition.

In the context of Examples, the symbols Vi, Ph, Me and Ep represents a vinyl group, a phenyl group, a methyl group and an epoxy group, respectively.

1. Evaluation of Device Properties

The device properties were evaluated using a 6030 LED package prepared with polyphthalamide (PPA). More particularly, a curable composition was dispensed into a PPA cup, and cured at a constant temperature of 70° C. for 30 minutes, and then at a constant temperature of 150° C. for an hour to manufacture a surface-mounted LED. Then, a thermal impact test and a long-term reliability test were carried out, as follows:

(1) Thermal Impact Test

One cycle, in which the surface-mounted LED was kept at a constant temperature of −40° C. for 30 minutes, and then kept at a constant temperature of 100° C. for 30 minutes, was repeated 10 times (i.e., a total of 10 cycles). Thereafter, the surface-mounted LED was kept at room temperature, and a peeling state was evaluated to determine the thermal shock resistance. During the evaluation, a total of 10 surface-mounted LEDs prepared with the same curable composition were subjected to the thermal shock test, and the number of peeled LEDs was counted, which is listed in the following Table 1.

(2) Long-Term Reliability Test

The surface-mounted LED was allowed to operate for 200 hours while allowing the surface-mounted LED to flow at an electric current of 30 mA under constant conditions: a temperature of 85° C. and a relative humidity of 85%. Thereafter, a decrease in final brightness after operation of an LED with respect to initial brightness before operation of the LED was measured, and evaluated according to the following criteria.

<Evaluation Criteria>

○: A decrease in final brightness with respect to initial brightness is less than or equal to 10% x: A decrease in final brightness with respect to initial brightness is greater than 10%

2. Measurement of Light Transmittance

Silica was mixed at a content of 2% by weight with each of the curable compositions prepared in Examples and Comparative Examples, and coated onto a substrate. The resulting composition was cured at a constant temperature of 60° C. for 30 minutes, and then at a constant temperature of 150° C. for an hour to prepare a planar specimen having a thickness of 1 mm. Thereafter, the planar specimen was measured for light transmittance in a thickness direction of the specimen with respect to light with a wavelength of 450 nm using a UV-VIS spectrometer, and evaluated according to the following criteria.

<Evaluation Criteria for Light Transmittance>

○: Light transmittance is greater than or equal to 85% x: Light transmittance is less than 85%

3. Evaluation of Device Brightness Characteristics

The device characteristics were evaluated using a 5630 LED package prepared with polyphthalamide (PPA). More particularly, a curable composition including a fluorescent material was dispensed into a PPA cup, and cured at a constant temperature of 60° C. for 30 minutes, and then at a constant temperature of 150° C. for an hour to manufacture a surface-mounted LED. Thereafter, brightness of a device was measured while allowing the surface-mounted LED to flow at an electric current of 20 mA.

<Evaluation Criteria for Brightness>

○: Brightness is greater than or equal to 60 ml x: Brightness is less than 60 ml 4. Evaluation of Refractive Index A refractive index of a composition including all the components other than the particles in the curable composition, or a cured product thereof was measured with respect to light with a wavelength of 450 nm according to the manufacturer's manual using an Abbe refractometer (4T commercially available from ATAGO Co., Ltd.). Also, a refractive index of the particles was measured with respect to light with a wavelength of 450 nm according to the manufacturer's manual using a reference solution for measuring a refractive index (Trade name: Refractive Index LiquidsRF-1 commercially available from Cargille LABS).

Example 1

Compounds represented by the following Formulas 1 to 4 were blended to prepare a curable composition which was able to be cured by a hydrosilylation reaction (the compounds of Formulas 1 to 4 were blended at contents of 100 g, 10 g, 200 g, and g, respectively). Thereafter, a catalyst (platinum(0)-1,3-divinyl-1,1,3,3-tetramethyldisiloxane) was blended so that a content of Pt(0) amounted to approximately 10 ppm, and then uniformly mixed. Then, 2 g of aluminosilicate particles having an average particle size of approximately 20 nm and a refractive index of 1.50 was further blended, and then uniformly mixed to prepare a curable composition. A refractive index of a cured product prepared from a composition including all the components other than the aluminosilicate particles in the prepared curable composition was approximately 1.53.

$$(ViMe_2SiO_{1/2})_2(ViMeSiO_{2/2})_2(PhMeSiO_{2/2})_{40} \quad \text{[Formula 1]}$$

$$(ViMe_2SiO_{1/2})_2(EpSiO_{2/2})_2(MePhSiO_{2/2})_{20} \quad \text{[Formula 2]}$$

$$(ViMe_2SiO_{1/2})_3(Ph_0SiO_{2/2})_{0.5}(PhSiO_{3/2})_6(SiO_{4/2})_1 \quad \text{[Formula 3]}$$

$$(HMe_2SiO_{1/2})_2(Ph_2SiO_{2/2})_{1.5} \quad \text{[Formula 4]}$$

Example 2

A curable composition was measured in the same manner as in Example 1, except that compounds represented by the following Formula 5 to 8 were blended to prepare a curable composition which was able to be cured by a hydrosilylation reaction (the compounds of Formulas 5 to 8 were blended at contents of 100 g, 50 g, 20.7 g, and 3.5 g, respectively). A refractive index of a cured product prepared from a composition including all the components other than the aluminosilicate particles in the prepared curable composition was in a range of approximately 1.53 to 1.55.

$$[ViMe_2SiO_{1/2}]_2[Me_2SiO_{2/2}]_9[Ph_2SiO_{2/2}]_{10}[PhMeSiO_{2/2}]_4 \quad \text{[Formula 5]}$$

$$[ViMeSiO_{2/2}][PhMeSiO_{2/2}][PhSiO_{3/2}]_{10}[ViMe_2SiO_{1/2}] \quad \text{[Formula 6]}$$

$$[HMe_2SiO_{1/2}]_2[Ph_2SiO_{2/2}] \quad \text{[Formula 7]}$$

$$[ViMe_2SiO_{1/2}]_2[EpSiO_{3/2}]_2[PhMeSiO_{2/2}]_{10} \quad \text{[Formula 8]}$$

Example 3

A curable composition was prepared in the same manner as in Example 2, except that the compounds of Formulas 5 to 8 were mixed at contents of 100 g, 100 g, 31.2 g, and 4.7 g, respectively. A refractive index of a cured product prepared from a composition including all the components other than the aluminosilicate particles in the curable composition was in a range of approximately 1.53 to 1.55.

Example 4

A curable composition was prepared in the same manner as in Example 2, except that the compounds of Formulas 5 to 8 were mixed at contents of 100 g, 300 g, 73.3 g, and 9.7 g, respectively. A refractive index of a cured product prepared from a composition including all the components other than the aluminosilicate particles in the curable composition was in a range of approximately 1.53 to 1.55.

Example 5

A curable composition was prepared in the same manner as in Example 2, except that the compounds of Formulas 5 to 8 were mixed at contents of 100 g, 700 g, 157.2 g, and 19.6 g, respectively. A refractive index of a cured product prepared from a composition including all the components other than the aluminosilicate particles in the curable composition was in a range of approximately 1.53 to 1.55.

Example 6

A curable composition was prepared in the same manner as in Example 2, except that a compound represented by the following Formula 9, and the compounds of Formulas 6 to 8 were mixed at contents of 100 g, 50 g, 13.5 g, and 3.4 g, respectively.

A refractive index of a cured product prepared from a composition including all the components other than the aluminosilicate particles in the curable composition was in a range of approximately 1.53 to 1.55.

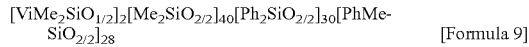  [Formula 9]

Example 7

A curable composition was prepared in the same manner as in Example 2, except that the compound of Formula 9 and the compounds of Formulas 6 to 8 were mixed at contents of 100 g, 100 g, 23.9 g, and 4.6 g, respectively. A refractive index of a cured product prepared from a composition including all the components other than the aluminosilicate particles in the curable composition was in a range of approximately 1.53 to 1.55.

Example 8

A curable composition was prepared in the same manner as in Example 2, except that the compound of Formula 9 and the compounds of Formulas 6 to 8 were mixed at contents of 100 g, 300 g, 64.1 g, and 9.5 g, respectively. A refractive index of a cured product prepared from a composition including all the components other than the aluminosilicate particles in the curable composition was in a range of approximately 1.53 to 1.55.

Example 9

A curable composition was prepared in the same manner as in Example 2, except that the compound of Formula 9 and the compounds of Formulas 6 to 8 were mixed at contents of 100 g, 700 g, 145.2 g, and 19.2 g, respectively. A refractive index of a cured product prepared from a composition including all the components other than the aluminosilicate particles in the curable composition was in a range of approximately 1.53 to 1.55.

Example 10

A curable composition was prepared in the same manner as in Example 2, except that a compound represented by the following Formula 10, and the compounds of Formulas 6 to 8 were mixed at contents of 100 g, 50 g, 37.2 g, and 3.9 g, respectively. A refractive index of a cured product prepared from a composition including all the components other than the aluminosilicate particles in the curable composition was in a range of approximately 1.53 to 1.55.

  [Formula 10]

Example 11

A curable composition was prepared in the same manner as in Example 2, except that the compound of Formula 10 and the compounds of Formulas 6 to 8 were mixed at contents of 100 g, 100 g, 47.8 g, and 5.1 g, respectively. A refractive index of a cured product prepared from a composition including all the components other than the aluminosilicate particles in the curable composition was in a range of approximately 1.53 to 1.55.

Example 12

A curable composition was prepared in the same manner as in Example 2, except that the compound of Formula 10 and the compounds of Formulas 6 to 8 were mixed at contents of 100 g, 300 g, 89.7 g, and 10.0 g, respectively. A refractive index of a cured product prepared from a composition including all the components other than the aluminosilicate particles in the curable composition was in a range of approximately 1.53 to 1.55.

Example 13

A curable composition was prepared in the same manner as in Example 2, except that the compound of Formula 10 and the compounds of Formulas 6 to 8 were mixed at contents of 100 g, 700 g, 173.6 g, and 19.8 g, respectively. A refractive index of a cured product prepared from a composition including all the components other than the aluminosilicate particles in the curable composition was in a range of approximately 1.53 to 1.55.

Example 14

A curable composition was prepared in the same manner as in Example 1, except that silica particles having an average particle size of 20 nm and a refractive index of 1.43 were used instead of the aluminosilicate particles.

Example 15

A curable composition was prepared in the same manner as in Example 1, except that the aluminosilicate particles were blended at a content of approximately 10 g.

Comparative Example 1

A curable composition was prepared in the same manner as in Example 2, except that zirconia particles having an average particle size of 20 nm and a refractive index of 2.1 were used instead of the aluminosilicate particles.

Comparative Example 2

A curable composition was prepared in the same manner as in Example 1, except that the aluminosilicate particles were not used.

Comparative Example 3

A curable composition was prepared in the same manner as in Example 1, except that silica particles having an average particle size of 20 nm and a refractive index of 1.41 were used instead of the aluminosilicate particles.

Comparative Example 4

A curable composition was prepared in the same manner as in Example 1, except that aluminosilicate particles were used at a content of approximately 35 g.

The evaluation results of the prepared curable compositions are summarized and listed in the following Table 1.

TABLE 1

|  |  | Thermal impact characteristics | Reliability | Light transmittance | Device brightness |
|---|---|---|---|---|---|
| Examples | 1 | 0/10 | ○ | ○ | ○ |
|  | 2 | 0/10 | ○ | ○ | ○ |
|  | 3 | 0/10 | ○ | ○ | ○ |
|  | 4 | 0/10 | ○ | ○ | ○ |
|  | 5 | 0/10 | ○ | ○ | ○ |
|  | 6 | 0/10 | ○ | ○ | ○ |
|  | 7 | 0/10 | ○ | ○ | ○ |
|  | 8 | 0/10 | ○ | ○ | ○ |
|  | 9 | 0/10 | ○ | ○ | ○ |
|  | 10 | 0/10 | ○ | ○ | ○ |
|  | 11 | 0/10 | ○ | ○ | ○ |
|  | 12 | 0/10 | ○ | ○ | ○ |
|  | 13 | 0/10 | ○ | ○ | ○ |
|  | 14 | 0/10 | ○ | ○ | ○ |
|  | 15 | 0/10 | ○ | ○ | ○ |
| Comparative Examples | 1 | 0/10 | x | x | x |
|  | 2 | 9/10 | x | ○ | ○ |
|  | 3 | 0/10 | ○ |  |  |
|  | 4 | 9/10 | x | x | x |

The invention claimed is:

1. A curable composition comprising:
   (A) a polymerization reaction product comprising a polyorganosiloxane having an aryl group bound to a silicon atom and an unsaturated aliphatic bond and represented by an average compositional formula of Formula 4, wherein the polymerization reaction product is a polymerization reaction product of a mixture including a compound represented by Formula 8 and a compound represented by Formula 9; and a compound represented by Formula 10, or a polyorganosiloxane having an average compositional formula represented by Formula 11:

$(R^{11}_3SiO_{1/2})_l(R^{11}_2SiO_{2/2})_m(R^{11}SiO_{3/2})_n(SiO_{4/2})_o$ [Formula 4]

wherein $R^{11}$'s are each independently an epoxy group, a (meth)acryloyl group, an isocyanate group, or a monovalent hydrocarbon group, provided that at least one of $R^{11}$'s is an alkenyl group and that at least one of $R^{11}$'s is an aryl group; the sum (l+m+n+o) of l, m, n and o is 1, n is in a range of 0.01 to 0.30, and m/(m+n+o) is in a range of 0.7 to 1, and wherein l, m, n and o represent molar ratios of the siloxane units of Formula 4,

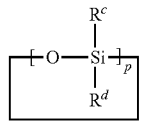
[Formula 8]

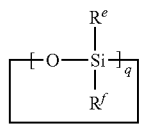
[Formula 9]

wherein $R^c$ and $R^d$ are each independently an alkyl group, $R^e$ and $R^f$ are each independently an aryl group, p is from 3 to 6, and q is from 3 to 6:

$[R^gSiO_{3/2}]$ [Formula 10]

$[R^hR^i_2SiO_{1/2}]_p[R^jSiO_{3/2}]_q$ [Formula 11]

wherein $R^g$, $R^h$ and $R^j$ are each independently an epoxy group, a (meth)acryloyl group, an isocyanate group, or a monovalent hydrocarbon group, $R^i$ is an alkyl group having 1 to 4 carbon atoms, p is from 1 to 3, and q is from 1 to 10; and (B) a particle satisfying the following Equation 1 in an amount from 0.1 to 30 parts by weight, relative to 100 parts by weight of the polyorganosiloxane:

$|A-B| \leq 0.1$ [Equation 1]

wherein A represents a refractive index of the curable composition that does not comprise the particle or a cured product thereof, and B represents a refractive index of the particle.

2. The curable composition of claim 1, wherein a molar percentage of the total moles of the aryl group bound to the silicon atom of the polyorganosiloxane with respect to the moles of all functional groups bound to silicon atoms of the polyorganosiloxane in the polymerization reaction product (A) is in a range from 30% to 60%.

3. The curable composition of claim 1, wherein the polyorganosiloxane comprises a siloxane unit represented by the following Formula 3, and a molar percentage of the total moles of difunctional siloxane units in the polyorganosiloxane with respect to the moles of the siloxane unit of Formula 3 is 30% or more:

$(R^9R^{10}SiO_{2/2})$ [Formula 3]

wherein $R^9$ is an epoxy group, a (meth)acryloyl group, an isocyanate group, or a monovalent hydrocarbon group, and $R^{10}$ is an aryl group.

4. The curable composition of claim 3, wherein both of the $R^9$ and $R^{10}$ in the siloxane unit of Formula 3 are aryl groups.

5. The curable composition of claim 1, wherein the refractive index of the particle is 1.45 or more.

6. The curable composition of claim 1, wherein the particle is silica, organosilica, alumina, aluminosilica, titania, zirconia, cerium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate or magnesium oxide.

7. The curable composition of claim 1, further comprising a cross-linked polyorganosiloxane (C) having an average compositional formula represented by the following Formula 13:

$(R^{22}_3SiO_{1/2})_a(R^{22}_2SiO_{2/2})_b(R^{22}SiO_{3/2})c(SiO_{4/2})_d$ [Formula 13]

wherein $R^{22}$ is each independently an epoxy group, a (meth)acryloyl group, an isocyanate group, or a monovalent hydrocarbon group, provided that at least one of $R^{22}$ is an alkenyl group, and that at least one of $R^{22}$ is an aryl group, the sum (a+b+c+d) of a, b, c and d is 1, a is in a range of 0 to 0.5, b is in a range of 0 to 0.3, c is in a range of 0.3 to 0.95, d is in a range of 0 to 0.2, and b/(b+c+d) is less than or equal to 0.3, and c/(c+d) is greater than or equal to 0.8.

8. The curable composition of claim 1, further comprising a photoconversion material.

9. A photonic semiconductor package comprising a photonic element encapsulated by a cured product of the curable composition defined in claim 1.

10. A liquid crystal display device comprising the photonic semiconductor package defined in claim 9 as a backlight unit.

11. A lighting device comprising the photonic semiconductor package defined in claim 9.

* * * * *